United States Patent
Lantsman

[11] Patent Number: 5,830,330
[45] Date of Patent: Nov. 3, 1998

[54] METHOD AND APPARATUS FOR LOW PRESSURE SPUTTERING

[75] Inventor: Alexander D. Lantsman, Middletown, N.Y.

[73] Assignee: Tokyo Electron Limited, Tokyo, Japan

[21] Appl. No.: 861,958

[22] Filed: May 22, 1997

[51] Int. Cl.$^6$ .................................................. C23C 14/34

[52] U.S. Cl. .............................. 204/192.12; 204/192.13; 204/298.06; 204/298.07

[58] Field of Search ................. 204/192.12, 192.13, 204/298.03, 298.06, 298.07, 298.08, 298.16, 298.18, 298.14

[56] References Cited

U.S. PATENT DOCUMENTS

| | | | |
|---|---|---|---|
| 4,999,096 | 3/1991 | Nihei et al. | 204/192.3 |
| 5,178,739 | 1/1993 | Barnes et al. | 204/192.12 |
| 5,431,799 | 7/1995 | Mosely et al. | 204/298.06 |
| 5,639,357 | 6/1997 | Xu | 204/298.06 |

*Primary Examiner*—M. Nuzzolillo
*Assistant Examiner*—Rodney G. McDonald
*Attorney, Agent, or Firm*—Wood, Herron & Evans, L.L.P.

[57] ABSTRACT

Sputtering processes are carried out at low pressure, of less than one milli-Torr, particularly in the range of 0.05 to 0.5 mTorr, to reduce scattering of the sputtered particles due to collisions with atoms of the process gas, particularly for coating contacts at the bottoms of sub-micron sized holes of high aspect ratios. The sputtering is made possible by provision for a supplemental RF plasma generating source by which RF energy is reactively coupled into the gas within the chamber in close proximity to the surface of a sputtering target, preferably adjacent the periphery thereof. The pressure in the chamber as well as the power to an RF electrode by which the supplemental plasma is energized and the DC power by which the main target is energized are dynamically controlled so that the plasma is sustained at low pressure. First, the pressure in the chamber is raised to above 1 mTorr while the RF power on the supplemental electrode is applied to ignite the plasma, then this RF power is reduced and DC power on the target is increased to an operating level, whereupon the pressure in the chamber is reduced to below 1 mTorr for the low pressure sputtering of the wafer.

12 Claims, 2 Drawing Sheets

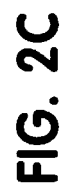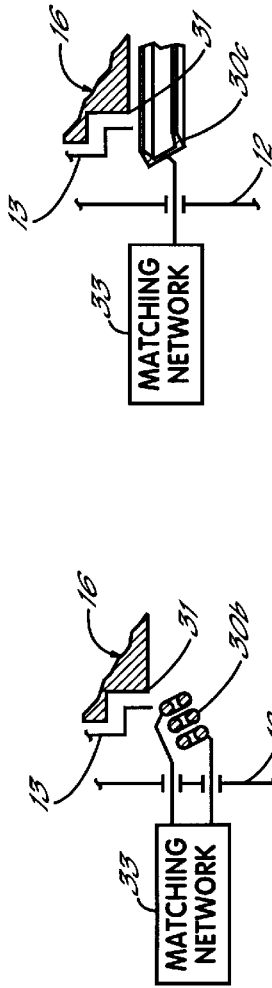
FIG. 2C
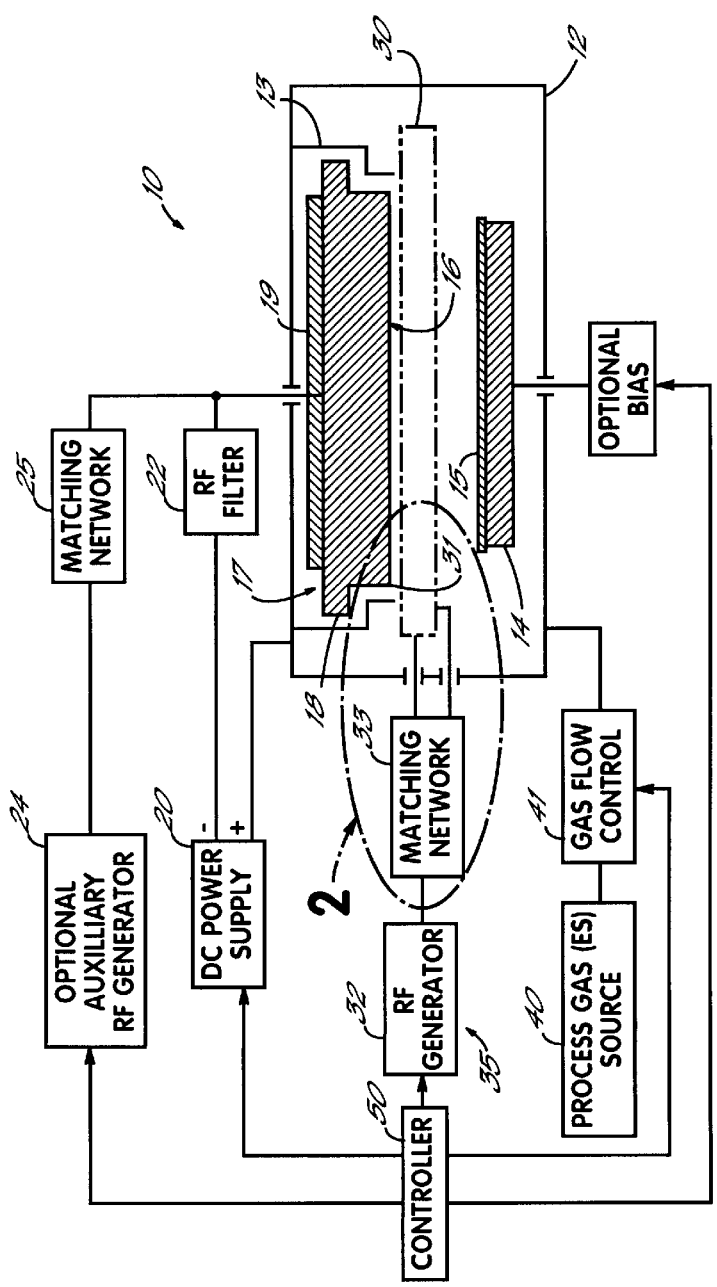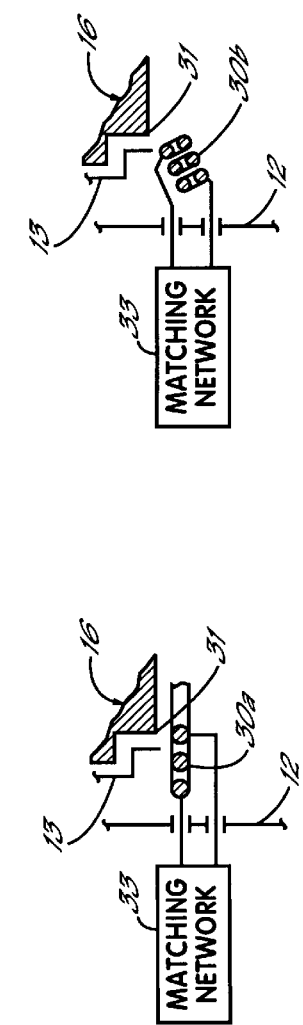
FIG. 2B
FIG. 1
FIG. 2A

METHOD AND APPARATUS FOR LOW PRESSURE SPUTTERING

This invention relates to the low pressure sputtering, and more particularly, to a method and apparatus for igniting and sustaining plasma in sputter coating of high aspect ratio features at pressures of less than 1.0 milli-Torr, and particularly in the range of 0.05 to 0.5 mTorr and below.

BACKGROUND OF THE INVENTION

In the fabrication of Very Large Scale Integration (VLSI) semiconductor devices, features are becoming smaller and smaller. Presently, it is necessary to metallize contacts at the bottoms of high aspect ratio features that are in the range of 0.25 to 0.35 microns in width. Metallizing such contacts by a sputter coating processes is desirable because sputtering presents commercial advantages in time, cost and simplicity of equipment over alternative processes, particularly where devices on the substrate would sustain damage if subjected to the elevated temperatures required with coating processes such as chemical vapor deposition (CVD). With the decreasing sizes of features and high aspect ratios, however, increasing demands are made of the sputtering process and the need to achieve a higher degree of directionality of the sputtered material. Unless the paths of the particles of sputtered material incident on the substrate can be maintained normal to the substrate surface, the attempt to sputter coat high aspect ratio holes is not effective.

A sputter coating process is typically carried out by placing the substrate and a target of coating material into a vacuum chamber filled with an inert gas such as argon and creating a plasma in the gas, with the target being maintained at a negative potential, functioning as a cathode which supplies electrons to sustain the plasma. The target is typically part of a magnetron cathode assembly in which magnets behind the target trap the electrons over the surface of the target where they collide with atoms of the argon gas, stripping electrons from the atoms and converting them into positive ions. The argon ions are accelerated toward the negative target where they collide with the surface and eject particles of target material, which propagate through the vacuum chamber where some strike and coat the substrate. Various schemes have been proposed to cause the propagating target particles to move in straight lines that are mostly normal to the substrate surface. Interposing a collimator between the target and substrate is one such scheme and increasing the target to substrate spacing, known as long-throw sputtering, is another. Collimators provide a source of particulate contamination and a variable rate of deposition, while both of these methods tend to substantially decrease the deposition rate. Long throw sputtering results in asymmetric or otherwise poor step coverage off the center of the wafer. Ionizing the particles and electrically accelerating them toward the substrate by means of RF biasing of the wafer's pedestal is another method proposed to maintain the desired perpendicular directionality of the sputtered particles moving toward the substrate. Such schemes have had limited success and are not broadly utilized.

Regardless of the method of orienting the paths of the sputtered particles normal to the substrate, particles moving toward the substrate at the typical pressures of 1 to 3 mTorr used in sputtering undergo collisions with argon gas atoms on their way to the substrate. These collisions cause the particles to scatter. The scattering redirects many of the particles along paths that impinge at angles on the substrates, where they enter recessed features so as to strike predominantly the sidewalls rather than the bottoms where coating may be preferred. Reduction of the pressure in the chamber produces a corresponding reduction in the number of collisions that the particles encounter. However, below 1 mTorr, sustaining a DC or pulsed DC plasma becomes increasingly difficult and requires modifications to the cathode that increase cost and complexity. Furthermore, it is well known that lower process pressures reduce the amount of impurities available for incorporation in the growing film, thereby improving film purity and the reliability of integrated devices formed of such films.

Accordingly, there remains the problem of maintaining the directionality of sputtered material when high aspect ratio features must be coated, and there remains a need for sustaining a plasma when sputtering is carried out at low pressure, particularly at 1 mTorr and below.

SUMMARY OF THE INVENTION

A primary objective of the present invention is to provide for the sputter coating of high aspect ratio features of VLSI semiconductor devices, and particularly, enhance the effectiveness of highly directional sputter coating of contacts at the bottoms of such features. A particular objective of the present invention is to reduce the scattering of sputtered particles and to maintain the directionality of sputtering particles in a sputter coating process.

Another objective of the present invention is to provide a method and apparatus for sustaining a plasma in low pressure plasma processing applications. A more particular objective of the present invention is to sustain a low pressure plasma in sputter coating applications, for example, for the coating of high aspect ratio features at processing pressures of less than 1 mTorr, such as in the 0.05 to 0.5 range and lower.

According to the principles of the present invention, loss of directionality of the sputtered material moving toward the substrate is reduced by sputtering at low pressure, below the typical 1 to 3 mTorr, for example, within the range of 0.05 to 0.5 mTorr, and at even lower pressures. According to other principles of the present invention, a plasma is sustained at low pressure by providing a supplementary plasma in addition to the main plasma used for ionizing the gas employed in the sputtering of material from the target.

According to the preferred embodiment of the invention, a low pressure sputter coating process is provided, preferably at sub-mTorr pressures, such as in the range of 0.05 to 0.5 mTorr, and a main plasma, such as a DC or pulsed DC magnetron enhanced plasma, is sustained by providing a supplementary RF plasma close to the surface of the target. The supplemental plasma and low sputtering pressures are particularly useful in combination with substrate biasing to improve coverage and film quality. The supplementary plasma may be inductively or capacitively coupled. Dynamic control of the process gas pressure is used to facilitate ignition of the supplementary plasma and to subsequently sustain the plasma at low pressure. In particular, the process gas is first maintained in the 1 to 30 mTorr range while the supplemental plasma is ignited, and then lowered to the sub-mTorr range for processing, preferably in a range of 0.05 to 0.5 mTorr. Further, deposition rate is controlled by varying the level of power to the target.

The preferred embodiments include the use of RF energy inductively coupled to a single coil at the target periphery to create the supplemental plasma, with the coil preferably placed close to the magnetron target and the dark space shield. Other forms of coils such as, for example, a partitioned helical coil may be used. Alternative embodiments include RF energy capacitively coupled to a separate RF target, placed in proximity to the edge of the main target, with the separate target being made of the same material as the main sputtering target. The separate target may also have its own magnetron and a dark space shield to render the separate target capable of more efficient energization of the process gas.

Upon start up of the process of the preferred embodiment of the present invention, the flow rate of process gas into the chamber is preferably increased to achieve a level of pressure sufficient for ignition of the supplemental RF plasma. Power for the RF plasma is preferably also increased for ignition of the RF plasma. Once the RF plasma is ignited and stabilized, the main DC plasma is developed by applying power to the target, which may also be at a higher pressure. Following the stabilization of the RF plasma, before or after ignition of the main plasma at the target, pressure is reduced to a sub-mTorr range.

Preferably, the electrode or element to which the RF energy is coupled to produce the supplemental RF plasma is configured and positioned to prevent DC and RF shorts from developing during use of the apparatus. Gaps, slots, segmentation and spaces are preferably employed to prevent the formation of direct shorts as well as RF eddy currents in the element itself. The element should have a small dimension or low profile in the target substrate direction to avoid the need to significantly increase the target to substrate distance to accommodate the element. Water cooling of the element is also preferably provided. The element may be provided with an insulative coating to prevent unwanted current flow, may have a surface treatment to enhance the adhesion of target material to reduce flaking and contamination, and may be formed of or coated with a material that is identical to that of the main target or coated with an inert material such as quartz or a ceramic material, particularly when the etching rate of the element exceeds the rate of deposition of sputtered material on the element. The element is preferably positioned out of the target-to-substrate path, and preferably such that it receives minimal deposition of material from the main target. In one preferred embodiment, the element is placed behind the plane of the sputtering face of the main target.

The present invention increases the directionality of a sputter coating process, particularly for coating of high aspect features on a semiconductor wafer surface. The invention reduces scattering of the particles of sputtered material and facilitates maintenance of a DC or pulsed DC plasma at low sub-mTorr pressures. With the invention, deposition can be carried out with low pressure at a high rate and with low contamination. The invention may also be used for etching, where the substrate to be etched is a cathode, with the RF element or electrode adjacent the cathode to sustain an etching plasma.

These and other objectives and advantages of the present invention will be more readily apparent from the following detailed description of the preferred embodiments of the invention, in which:

BRIEF DESCRIPTION OF THE DRAWINGS

FIG. 1 is a diagrammatic representation of a sputtering apparatus according to one embodiment of the present invention.

FIG. 2A is a diagrammatic representation of a portion designated 2 in FIG. 1 illustrating in more detail one form of an RF supplementary plasma coupling element.

FIG. 2B is a diagrammatic representation similar to FIG. 2A illustrating an alternative form of an RF supplementary plasma coupling element.

FIG. 2C is a diagrammatic representation similar to FIGS. 2A and 2B illustrating a further alternative form of an RF supplementary plasma coupling element.

DETAILED DESCRIPTION OF THE PREFERRED EMBODIMENT

Figure 3:
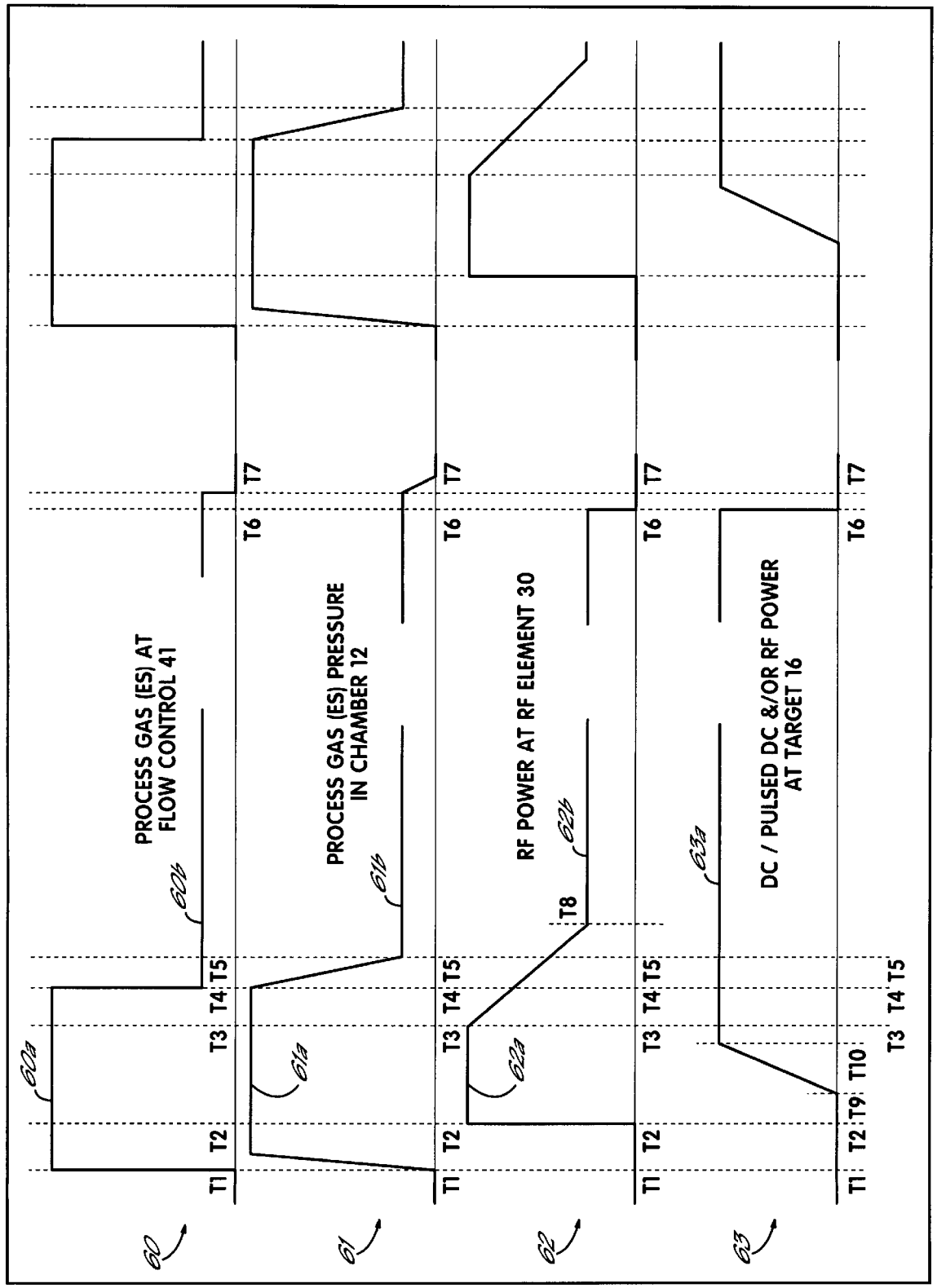
FIG. 3 is a timing diagram of one embodiment of the operation of the apparatus of FIG. 1.

FIG. 1 diagrammatically illustrates a sputter coating apparatus 10 according to principles of the present invention. The apparatus 10 includes a vacuum tight sputter processing chamber 12 having mounted therein a wafer support or susceptor 14 with a semiconductor wafer 15 thereon. The wafer is facing a target 16 of sputter coating material of a type that is to be deposited as a thin film on the wafer 15. The target 16 is part of a cathode assembly 17 that includes a target holder 18, to which the target 16 is secured, and a magnet pack 19. A dark space shield 13 may also be provided around the periphery of the target 16. The magnet pack 19 preferably includes magnets that produce a closed magnetic tunnel that traps over the surface of the target 16 electrons given off by the cathode assembly 17 into gas within the chamber.

The apparatus 10 includes a source of DC power 20, which may be switched on to remain constant or may be pulsed, which is connected to the cathode assembly 17 through an RF filter 22. An auxiliary source of energy such as an RF generator 24 may also be optionally connected to the cathode assembly 17, which would be connected through a matching network 25. An optional bias circuit 27 may also be provided and connected to the substrate holder 14 to apply a bias to a wafer 15.

According to certain embodiments of the present invention, a coupling element 30 is provided in close proximity to the surface of the target 16. Preferably, the element is maintained close to peripheral edge 31 of the target 16, very near the dark space shield 13, and preferably either in the plane of the surface of the target 16 or slightly forward of or behind the surface of the target 16. An RF generator 32, preferably operative in the range of from 0.1 to 60 MHz is connected to the element 30 through a matching network 33. In one embodiment of the invention, the element 30 is a planar coil 30a, as illustrated in FIG. 2A, connected across two output leads of the RF energy source 35 that is made up of the generator 32 and matching network 33. The coil 30a serves to inductively couple RF energy from the source 35 into gas within the chamber 11 to form a supplementary plasma near the target 16. FIG. 2B illustrates a multiple winding segmented helical coil 30b which is an alternative to flat single coil 30a of FIG. 2A for forming the supplementary plasma.

In FIG. 2C there is illustrated a further alternative to the coils 30a and 30b, an annular supplemental target 30c. The target 30c is preferably made of the same material as target 16. Target 30c is connected to an output lead of the RF energy source 35 so as to capacitively couple RF energy into the gas to form the supplementary plasma.

A source of processing gas 40 is connected to the chamber 11, through a flow control device 41. For sputter processing, the gas from the supply 40 is typically an inert gas such as argon. The control 41 regulates the flow of small amounts of gas into the chamber 11 to provide fine control of the pressure in the chamber once the chamber has been generally evacuated and brought down to a high vacuum by the use of a vacuum pump (not shown) connected to the chamber 11.

The apparatus 10 also includes a main controller 50 that is preferably a microprocessor-based programmable controller operative to sequence and control the operation of the components discussed above. The controller 50 has outputs for controlling the energization of the cathode power supplies 20 and 24, the substrate bias power supply 27, the RF generator for energizing the supplemental plasma element 30 and the gas flow control 41. According to certain principles of the present invention, the controller 50 is programmed to operate the gas flow control 41 to cause a pressure in the chamber to rise to between 1 and 50 mTorr, then to cause the RF generator 32 to energize the element 30 to ignite and sustain a supplementary plasma in the chamber 11 in close proximity to the surface of the target 16. Once this plasma is stabilized, the controller 50 causes the pressure to be reduced to 0.5 mTorr or less and the power supply 20 to the main target 16 to be energized to produce the main plasma at target 16, with the RF supplementary plasma being sustained by RF energy reactively coupled form the element 30 to ignite and maintain the main plasma, which would not otherwise ignite at pressures below 1 mTorr. With this main plasma, a wafer 15 is processed at low pressures to better coat the bottoms of high aspect ratio features thereon.

FIG. 3 illustrates in more detail the manner in which the program of the controller 50 controls the apparatus 10. In FIG. 3, curve 60 represents a signal from the controller 50 to the gas flow control 41. In curve 60, the curve goes to a high flow value 60a for typically approximately 2 to 5 seconds beginning at time T1 (beginning of cycle) and terminating at time T4, (which is typically approximately 2 to 5 seconds after T1). In curve 61, the pressure begins to rise at time T1, reaches the desired higher pressure approximately in the range of 10–50 mTorr before a time T2, and remains above the one mTorr pressure until time T4, when it begins to drop. At time T4, the flow control signal changes to a low flow control value, typically achieved by signaling a flow of 1 to 100 sccm into the chamber 11, as illustrated at 60b on curve 60. This causes the pressure in the chamber 11 to drop from level 61a to level 61b from time T4 to time T5.

Curve 62 represents the RF power being delivered to the RF element 30 from the RF source 35. The controller 50 causes the RF energy, in the range of from 1 to 60 MHz, to rise at time T2 from zero to a level sufficient to ignite a plasma, typically to a power of 1 to 5 kW, as indicated at 62a of curve 62. This RF power remains at the high level 62a until time T3, which is from 0.5 to 3 seconds after times T1 and T2. From time T3 to time T8, which is approximately 0.5–5 seconds later than time T3, the RF power level is caused to decline from level 62a to a lower level 62b, which is anywhere from the minimum needed to sustain the plasma to a level that will enable control of the deposition rate onto the substrate 15. This level 62b is typically between 0.1 and 3 kW with a frequency of from 0.1 to 60 MHz.

Before time T3, and preferably before the pressure of process gas is reduced from the high level 61a to the low level 61b, the DC power on the target 16 is increased from zero to an operating power level 63a as illustrated in curve 63, which is typically between 0.5 and 30 kW for commonly used 12 inch diameter targets. The increase in target power will occur between times T9 and T10, or within up to approximately 5 seconds. The DC power will remain at level 63a on the target 16 until time T6, which is until the wafer 15 is processed, which can typically be from 10 seconds to several minutes from the time T10. At time T6, the DC power level 63a is removed from the target 16 and the sustaining RF power level 62b is removed from the supplemental element 30 at time T6 or later. Then at time T7, the gas flow is reduced to zero and the gas pressure thereupon declines to the lower pump down pressure. When the wafer is replaced with a new one, the cycle is repeated.

Those skilled in the art will appreciate that the applications of the present invention herein are varied, and that the invention is described in preferred embodiments. Accordingly, additions and modifications can be made without departing from the principles of the invention. The following is claimed:

I claim:
1. A method of sputtering comprising the steps of:
    supporting a substrate in a vacuum sputtering chamber facing a target of a sputter coating material mounted on a sputtering cathode assembly in the chamber;
    establishing a vacuum pressure of gas within the chamber;
    coupling RF energy from a supplemental plasma electrode into gas in the chamber;
    controlling the combined pressure in the chamber and the power to the supplemental plasma electrode at a level to ignite a plasma in the gas in the chamber;
    following ignition of the plasma:
        energizing the target with a target power supply so as to initiate the sputtering of coating material from the target with ions from the plasma; then
        while the target is energized, reducing the combined pressure and power to the supplemental plasma electrode to a level below that required for ignition of the plasma but above a level required to sustain the plasma so as to sputter the coating material from the target;
        then, continuing to energize the target to a degree sufficient to sputter material from the target at a pressure of less than 1 mTorr to thereby coat the substrate with the sputtered material.
2. The method of claim 1 further comprising the step of:
    providing the supplemental plasma electrode in the sputtering chamber in proximity to the sputtering cathode assembly.
3. The method of claim 1 further comprising the steps of:
    providing the supplemental plasma electrode in proximity to a peripheral edge of the target and in proximity to a dark space shield around the target in the chamber.
4. The method of claim 1 further comprising the step of:
    providing the supplemental plasma electrode in the sputtering chamber in proximity to a plane through a sputtering surface of the target.
5. The method of claim 1 further comprising the step of:
    symmetrically providing a partitioned helical coil in the chamber around the perimeter of the sputtering cathode assembly.
6. The method of claim 1 wherein:
    the target energizing step includes the step of energizing the sputtering cathode assembly with DC power.
7. The method of claim 1 wherein:
    the target energizing step includes the step of energizing the sputtering cathode assembly with pulsed DC power.
8. The method of claim 1 wherein the controlling step includes:

reducing the pressure from that required for ignition of the plasma to less than 1 mTorr and below that required for ignition of the plasma but above that required to sustain the plasma.

9. The method of claim 1 further comprising the step of:

controlling RF power to the supplemental plasma electrode to vary the coupled RF energy to control the deposition rate on the substrate.

10. The method of claim 1 further comprising the steps of:

biasing the substrate;

ionizing the material sputtered from the target with the plasma at a point remote from the target;

controlling the bias on the substrate to attract the ionized sputtered particles toward the substrate.

11. The method of claim 1 wherein:

the electrode is a supplemental target of sputtering in the chamber surrounding the target in close proximity to the periphery thereof;

the coupling step includes the step of energizing the plasma by capacitively coupling RF energy to the gas by applying the energy to the supplementary target.

12. The method of claim 1 wherein:

the coupling step includes the step of energizing a supplemental plasma by inductively coupling RF energy to the gas by applying the RF energy to a coil surrounding the target in proximity to the periphery thereof.

* * * * *